US008429492B2

(12) United States Patent
Yoon et al.

(10) Patent No.: US 8,429,492 B2
(45) Date of Patent: Apr. 23, 2013

(54) ERROR CORRECTING CODE PREDICATION SYSTEM AND METHOD

(75) Inventors: Tony Yoon, San Jose, CA (US); Saeed Azimi, Union City, CA (US)

(73) Assignee: Marvell World Trade Ltd., St. Michael (BB)

( * ) Notice: Subject to any disclaimer, the term of this patent is extended or adjusted under 35 U.S.C. 154(b) by 1485 days.

(21) Appl. No.: 12/022,746

(22) Filed: Jan. 30, 2008

(65) Prior Publication Data

US 2009/0144598 A1 Jun. 4, 2009

Related U.S. Application Data

(60) Provisional application No. 60/991,526, filed on Nov. 30, 2007.

(51) Int. Cl.
G11C 29/00 (2006.01)
G11C 29/52 (2006.01)
H03M 13/00 (2006.01)

(52) U.S. Cl.
USPC ........... 714/763; 714/773; 714/718; 714/774; 360/53; 365/200; 365/201

(58) Field of Classification Search ........... 714/752, 714/763, 770, 771, 773, 774; 365/200, 201
See application file for complete search history.

(56) References Cited

U.S. PATENT DOCUMENTS

| | | | | |
|---|---|---|---|---|
| 5,446,879 A | * | 8/1995 | Yamamoto et al. | 714/1 |
| 5,568,423 A | * | 10/1996 | Jou et al. | 365/185.33 |
| 6,024,486 A | * | 2/2000 | Olarig et al. | 714/763 |
| 6,721,919 B1 | * | 4/2004 | Morioka et al. | 714/801 |
| 6,751,766 B2 | * | 6/2004 | Guterman et al. | 714/736 |
| 6,807,648 B1 | * | 10/2004 | Cansever et al. | 714/776 |
| 7,117,421 B1 | * | 10/2006 | Danilak | 714/763 |
| 7,559,004 B1 | * | 7/2009 | Chang et al. | 714/758 |
| 7,904,780 B2 | * | 3/2011 | Brandman | 714/752 |
| 8,122,323 B2 | * | 2/2012 | Leung et al. | 714/774 |
| 8,296,625 B2 | * | 10/2012 | Diggs et al. | 714/762 |
| 2003/0023911 A1 | * | 1/2003 | Davis et al. | 714/723 |
| 2003/0037299 A1 | * | 2/2003 | Smith | 714/763 |
| 2005/0094459 A1 | | 5/2005 | Sesek et al. | |
| 2005/0172179 A1 | * | 8/2005 | Brandenberger et al. | 714/718 |
| 2008/0126908 A1 | * | 5/2008 | Lin | 714/758 |
| 2008/0222490 A1 | * | 9/2008 | Leung et al. | 714/763 |

FOREIGN PATENT DOCUMENTS

WO WO 2006/013529 A1 2/2006

* cited by examiner

*Primary Examiner* — Albert Decady
*Assistant Examiner* — Justin R Knapp

(57) ABSTRACT

In memory devices that degrade with use, a memory controller may monitor and record a usage history of portions of the memory. The memory controller can then vary a strength of error correction coding to protect information written to various portions of the memory having different usage histories. More specifically, and memory can receive information to be stored in the memory, select a portion of memory to store the information, and store the information in the selected portion of the memory with an error correction coding having a strength that is based on a usage history of the selected portion of the memory.

45 Claims, 6 Drawing Sheets

| 410 | 420 | 430 |
|---|---|---|
| USAGE THRESHOLD | STRENGTH | ECC OVERHEAD |
| COUNT < 10K | $ECC_A$ | 1.2 |
| 10K ≤ COUNT < 20K | $ECC_B$ | 1.4 |
| 20K ≤ COUNT < 30K | $ECC_C$ | 1.6 |
| ... | ... | ... |

| 510 | 520 | 530 |
|---|---|---|
| MEMORY UNIT ID | USAGE HISTORY | ECC |
| 0 | 10,500 | $ECC_B$ |
| 1 | 700 | $ECC_A$ |
| 2 | 35,000 | $ECC_C$ |
| 3 | 17,500 | $ECC_B$ |
| ... | ... | ... |

ERROR CORRECTING CODE PREDICATION SYSTEM AND METHOD

INCORPORATION BY REFERENCE

This application claims the benefit of U.S. provisional application No. 60/991,526, "Method of Using Different Error Correction Code Over Time in Solid State Devices" filed on Nov. 30, 2007, including all cited references, which are incorporated herein by reference in their entirety.

BACKGROUND

Memory devices contain memory cells that store data and can be read to retrieve the stored data. For various reasons, occasionally some memory cells are not able to reliably perform their storage or readout functions. Such memory cells may become weak and may lose their contents over time or they may become bad and cannot be either erased, re-programmed or both. The capacity for reliable memory storage in memory devices made from degradable memory cells may decrease with use. The degradation in a memory device's capacity may be exacerbated by strategies that discard memory elements that are accessed more than a predetermined number of times.

Memory cells may be addressed individually or may be arranged in blocks of a predefined size, such as 2 Kb, and addressed by block. When memory cells are arranged in an array, they may be addressed by cell row and cell column. Alternatively, when memory cells are organized into an array of blocks, they may be addressed by block row and block column.

Generally, memory devices are described by their memory capacity or size. Size descriptors typically give a memory device's capacity in either megabytes (Mb) or gigabytes (Gb). Smaller storage units, such as blocks, may be given in kilobytes (Kb). To define these terms precisely, a byte is 8 bits, a kilobyte is precisely 1024 bytes, a megabyte is 1024 Kb (1,048,576 bytes), and a gigabyte is 1,073,741,824 bytes. A Kb, Mb, and Gb are $2^{10}$, $2^{20}$, $2^{30}$ bytes, respectively.

The reliability of a memory device containing numerous memory cells can be a function of the memory cell semiconductor device technology, the semiconductor material system, the memory cell semiconductor process technologies, the likelihood and severity of various failure modes, and the failure criteria. Examples of semiconductor material systems include silicon, silicon-germanium, indium phosphide, gallium arsenide, and other compound semiconductors. Examples of semiconductor device technologies include complementary metal oxide semiconductor (CMOS, a silicon technology), bipolar junction transistor (BJT), integrated injection logic ($I^2L$), and others.

SUMMARY

In memory devices that degrade with use, a memory controller may monitor and record a usage history of portions of the memory. The memory controller can then vary a strength of error correction coding to protect information written to various portions of the memory having different usage histories.

Aspects of this disclosure are directed to method of storing information that can include receiving information to be stored in a memory, selecting a portion of the memory to store the information, and storing the information in the selected portion of the memory with an error correction coding having a strength that is based on a usage history of the selected portion of the memory. The usage history can include one or more states of the portions of the memory. Further, selecting a portion of the memory to store the information can include selecting a portion of the memory requiring a lower strength error correction code before a portion of the memory requiring a greater strength error correction code.

The method can further include storing the information in the memory as a block that includes both the information and parity bits. A ratio of information bits to information bits plus parity bits can decrease as the strength of the error correction coding increases. Accordingly, if a size of the block is fixed then, as the ratio of information bits to information bits plus parity bits decreases, an amount of information stored per block can decrease. As the amount of information stored in the block decreases, spillover information can be stored in another portion of the memory, such as a reserved portion of the memory. Additionally, the spillover information can be stored in the reserved portion of the memory with an error correction coding having a strength that is based on the usage history of the reserved memory portion.

An additional aspect of the disclosure includes selecting a portion of the memory to store the information based on a usage history. Selecting the portion of the memory to store the information based on the usage history can also include examining the usage history of available portions of the memory, and allocating a portion of the memory having a usage history indicating less use before a portion of the memory having a usage history indicating more use. Further, selecting a portion of the memory to store the information based on the usage history, can include examining the usage history of available portions of the memory, and allocating a portion of the memory having a usage history indicating less erasures before a portion of the memory having a usage history indicating more erasures. Also, selecting a portion of the memory to store the information based on the usage history can include examining the usage history of available portions of the memory, and allocating a portion of the memory having a usage history indicating a higher reliability before a portion of the memory having a usage history indicating a lesser reliability.

Aspects of the disclosure further describes a method of storing information that can include storing any spillover information resulting from using stronger error correction coding in another portion of the memory. The spillover information can be stored in a reserve portion of the memory. The spillover information can be stored in the reserve portion of the memory with an error correction coding having a strength that is based on a usage history of the reserve portion of the memory. Also, the spillover information can be stored in a reserve portion of the memory with the error correction coding having a same strength as that of the selected portion of the memory.

Further, aspects of the disclosure describes a method of storing information that can include selecting the strength of the error correction coding based on the usage history of the selected portion of the memory by determining whether the usage history exceeds a usage threshold, and, if so, adjusting the strength of the error correction coding. The usage threshold can be a number of times a portion of the memory has been erased. Adjusting the strength of the error correction coding can include increasing a number of parity bits that are stored with the information.

The disclosure is also directed to a method of storing information that can include selecting the strength of the error correction coding based on the usage history of the selected portion of the memory, by determining whether the usage history is within a first range and, if so, setting the strength of the error correction coding to a first level, determining whether the usage history is within a second range, and, if so, setting the strength of the error correction coding to a second level. The first level of the error correction coding can include less parity bits than the second level of error correction coding. Additionally, the error correction coding can include at least one of Hamming, BCH, and Reed-Solomon. More specifically, the first level of the error correction coding can include one of Hamming, BCH, and Reed-Solomon and the second level of the error correction coding can include a different one of Hamming, BCH, and Reed-Solomon.

BRIEF DESCRIPTION OF THE DRAWINGS

The invention will be described with reference to the accompanying figures, wherein like numerals represent like elements, and wherein:

FIG. 4 is an exemplary error correction coding lookup table;

FIG. 5 is an exemplary data structure for storing a usage history of a memory;

DETAILED DESCRIPTION OF EMBODIMENTS

Figure 1:
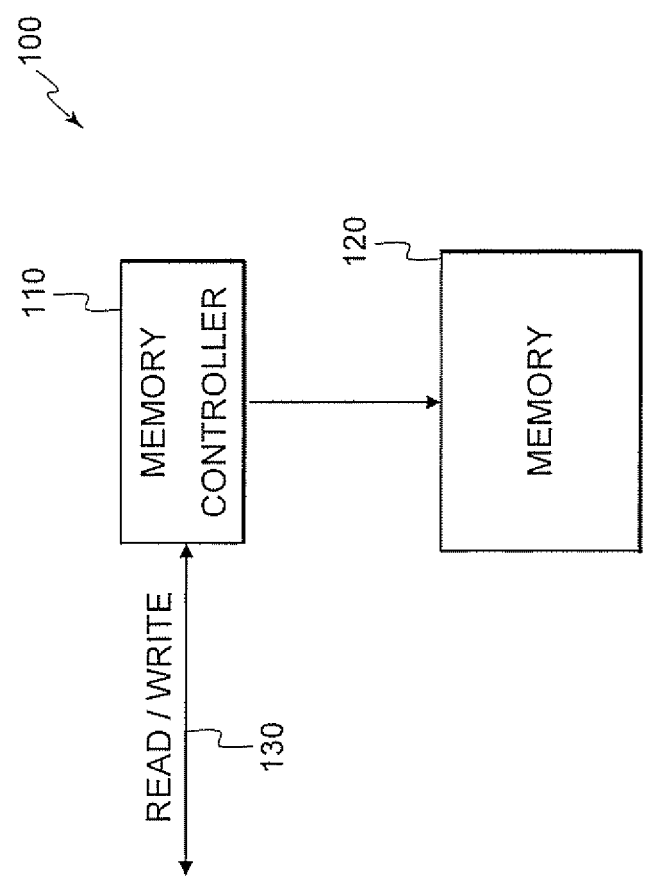
FIG. 1 is an exemplary block diagram of error correcting code predicator.

FIG. 1 shows an exemplary error correcting code predicator (ECCP) system 100. As shown, ECCP system 100 can include a memory controller 110 coupled to a memory 120.

In operation, memory controller 110 receives data from a bi-directional read/write bus 130. The memory controller 110 then writes the data to the memory 120 in accordance with a memory management plan. Additionally, memory controller 110 can retrieve data from memory 120 and write the data on the bi-directional read/write bus 130. The memory controller 110 can track usage of portions of the memory 120, as usage history for the memory 120. Based on the usage history of the memory 120, the memory controller 110 can selectively apply different strengths of error correction coding (ECC) to data written to various portions of the memory 120.

In this specification, different strengths of ECCs, such as stronger and weaker, can refer to ECCs that require more parity bits and fewer parity bits, respectively, whether the minimum error distance, such as a minimum Hamming distance, and/or correctable error burst lengths are larger or not. Higher overhead ECCs or lower overhead ECCs may be defined as stronger or weaker ECCs, respectively. Parity bits and information bits are discussed in this specification as separate fields in an active memory block whether a systematic block code is used or not. Information bits and parity bits appear explicitly in a systematic block code by definition. It should be appreciated that information bits and parity bits may be stored as codewords and the codeword length equals the number of information bits and parity bits. It should also be appreciated that an ECC may use non-binary symbols rather than bits, but that the information encoded by and decoded from such codewords may be converted to bits.

It should be appreciated that memory 120 may be an array of memory cells or an array of blocks of memory cells. When a memory unit is described as a block, then such a block may be implemented in a memory 120 that is cell structured or block structured. It should also be appreciated that certain parts of memory may be allocated as active memory and other parts may be designated reserve memory. The reserve memory plus the active memory can equal the total memory. In other words, the reserve memory can be the complement of the active memory.

ECCP system 100 can predicate its control of memory on the memory usage history in a way that can reduce memory consumption. ECCP system 100 can conserve memory and can ensure reliable read-back from memory 120 by tracking memory accesses. The ECCP system 100 can base its memory allocation and ECC strength decisions on such tracking.

In memory devices that degrade with use, a memory controller may monitor and record the number of times each memory unit has been erased and re-programmed. It should be appreciated that an erase operation and a re-program operation may be described as an erase cycle. It should also be appreciated that an erase cycle may precede a write operation so a write count or an erase count may be used interchangeably to describe some memory accesses.

In operation, memory controller 110 of the ECCP system 100 may allocate a portion of the memory 120 as an active memory and a separate portion as a reserve memory. Memory controller 110 may use a data stricture to track usage history for portions of memory. In other words, memory controller 110 may use the data structure to list memory units that are assigned to active memory and list their usage or it may list all memory units and their usage, and track which units are in active memory.

In an exemplary case, memory controller 110 can track the number of times an active memory block is written and compare the usage to a set of threshold values. Memory controller 110 can then use a stronger ECC to protect data written to that block. The stronger ECC can supplant either a default-strength ECC or the ECC most recently used for that block.

Because data written to that block with a stronger ECC can include more parity bits, some information bits may not now fit in the active memory block when a stronger ECC is used; these bits can be called spillover. When spillover occurs, memory controller 110 can allocate additional memory, such as by making some of the reserve memory available. The additional memory can accommodate both the spillover information bits and any parity bits needed to protect them. In an exemplary case, the ECC used to protect the spillover information bits can be a default-strength ECC, the most-recent strength ECC for that block, or a stronger ECC. In a similar manner to the ECC being chosen for the active memory block, the ECC for reserve memory can be selected based on a usage history. It should be appreciated that information bits that spillover from several active memory blocks can be aggregated to fill or nearly fill newly activated memory blocks.

In a similar example of operation, when a write count for an active memory block A exceeds a threshold count, memory block A's spillover information bits can be moved to a reserve memory block B that is activated from reserve memory. The information bits in reserve memory block B can then be protected by an ECC with a lower overhead than active memory block A. Later, and if necessary, subsequent write operations to the reserve memory block B can include strengthened ECC when block B's write count exceeds the threshold.

In an exemplary case, when the ECC strength increases, if reserve memory block B can accommodate more information bits than those that spillover from memory block A, then the unused bits in reserve memory block B may be written with dummy values, and protected with a default strength ECC. It should be appreciated that information bits that spillover from other active memory blocks C, D, E, can be aggregated to fill or partially fill the information field of reserve memory block B. Any unused bits may be put in a definite state, and protected with a default strength ECC.

As described above, a stronger ECC can be applied when protecting newly activated memory not having an extensive usage history. The stronger ECC can be used when an active memory block is written more than a specified number of times. Some information bits may spillover when the stronger ECC is used. In this case, ECCP system 100 can activate enough reserve memory units to accommodate both the spillover bits and the parity bits the stronger ECC needs to protect the spillover bits.

Figure 2:
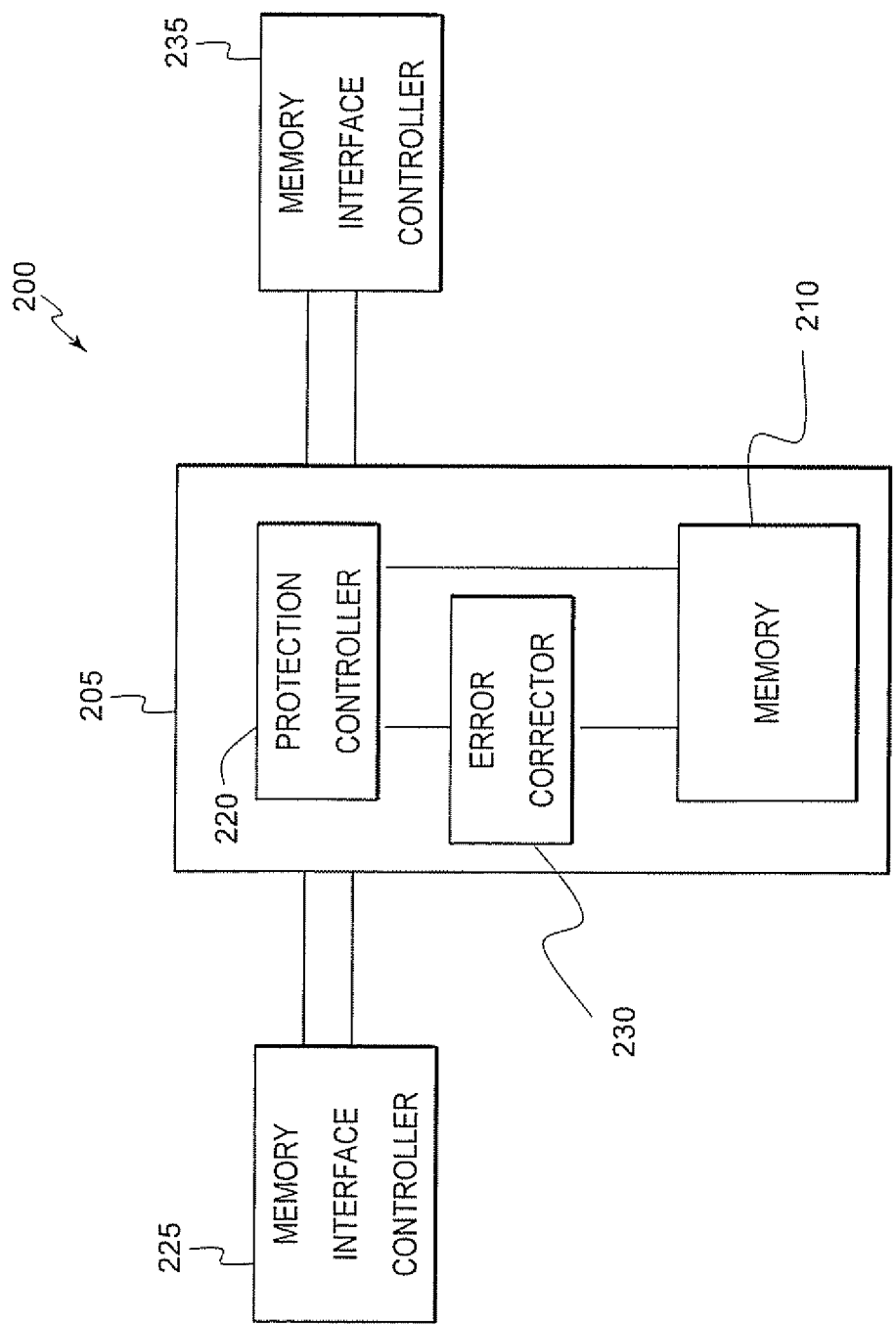
FIG. 2 is an exemplary block diagram of error correcting code predicator for multi-port memory.

FIG. 2 shows another exemplary ECCP system 200. As shown, the ECCP system 200 can include a memory interface controller 225, a protected memory 205, and a memory interface controller 235. The protected memory 205 can include protection controller 220, error corrector 230, and memory 210. Memory 210 can connect to protection controller 220 and to error corrector 230. Protection controller 220 can connect to memory 210 and to error corrector 230.

Protected memory 205 can communicate with memory interface controllers 225 or 235 through a bus. It should be appreciated that the connection of protected memory 205 to memory interface controller 225 or to memory interface controller 235 or both may implement single port, dual port, first-in first-out (FFO), or multi-port memories. It should also be appreciated that each bus may connect a plurality of devices.

In operation, either memory interface controller 225 or 235 may read data from or write data to protected memory 205 by, for example, supplying an address or a set of addresses and issuing a read or write command, respectively. As described above, it should be appreciated that a write command may be preceded by an erase command and may be followed by a verifying read operation.

In operation, protection controller 220, memory interface controller 225 and 235 can predicate memory management based on the usage history of memory 210. In other words, the usage history of memory 210 can be reported to either an internal controller, such as protection controller 220, or an external controller, such as memory interface controllers 225 or 235. One or more of these controllers can allocate ECC resources in error corrector 230 and the error corrector 230 can apply ECCs of varying strength to different units of memory based on the desired allocation.

In operation, commands from protection controller 220 can control the type of ECC code and code parameters used by error corrector 230. For example, such commands can include selecting a given number, k, of information bits, and generating a codeword with a given number of bits n. The ratio k/n is called the rate of the code or the code-rate. The quantity, n/k, can be called the uplift, coding overhead, or code strength, and may be expressed in percent. Some exemplary values of coding overhead are approximately 107%, 110%, 111%, 120%, 123%, and 125%. In an exemplary case protection controller 220 may command error corrector 230 to use Hamming, BCH, Reed-Solomon codes and the like.

The protection controller 220 can select the number of parity bits, the ECC codeword size, the ECC block structure, the code rate of the ECC, the ECC minimum error distance, and the ECC type used for some units of memory 210. Some exemplary ECC types include: block codes, convolutional codes, systematic codes, nonsystematic codes, binary codes, non-binary codes, turbo codes, LDPC codes, linear codes, nonlinear codes and the like. Protection controller 220 can determine the decoder structure including decoding metrics, such as hard bit decisions or soft bit likelihoods, and decoder truncation requirements. For example, truncation requirements can arise with Viterbi decoders used to decode convolutional codes.

In operation, the protected memory 205 can receive an instruction to store memory in memory 210. Upon receipt of the instruction, the memory interface controllers 225, 235 or the protection controller 220 can examine a usage history of the memory 210 stored within the protected memory 205. Based on the usage history and various other facts, the protection controller can allocate a portion of the memory 210 in which the data is to be stored.

Based on the usage history, the protection controller 220 can write the data to memory 210. Under the instruction of protection controller 220, the error corrector 230 may act upon the data to protect the data with an appropriate level of error correction. In a situation where the usage history indicates that the portion of the memory to be written to requires a high level of ECC, then the error correction controller can instruct the error corrector 230 to provide a higher level of error correction to the data written to that portion of the memory 210. Alternatively, if the usage history indicates that the portion of the memory 210 to be written to requires a lower level of ECC, then the protection controller 220 can similarly instinct the error corrector 230 to provide a lower level of error correction to the data, prior to writing the data into the memory 210.

As described above, generally information having a higher level of ECC requires additional memory space than identical information requiring lower ECC. Accordingly, under the control of protection controller 220, memory may be allocated in memory 210 as necessary to provide for the additional ECC. For example, the protection controller 220 may allocate a reserve memory block in the reserved memory of memory 210 to accommodate the additional or spillover bits. As described above, the data that is stored in the reserve memory can receive a default or lower level of ECC, or may similarly require a higher level of ECC based on the usage history. The relationship between the active memory block and the reserve memory block that contains the spillover can be tracked using various memory mapping techniques or algorithms, so that information can be later retrieved properly.

In view of the above, it will be apparent that portions of memory that have degraded can remain in use for the protected memory 205 by providing a higher level of error correction coding for those portions. By this method, as opposed to discarding degraded portions of the memory 210, an efficient memory usage technique is possible. In other words, because the technique continues to use degraded memory, and only incrementally requires additional memory to accommodate the spillover as a result of increased ECC, the system is highly efficient.

Tables 1 and 2 below can be used to describe a comparison between a memory system utilizing a discard method and the ECCP system in accordance with the present disclosure. An assumption for both examples is that an initial information capacity of the memory is 900 Mb. In the memory used in the discard method example, the 900 Mb memory for information is supplemented by a reserve memory of 100 Mb, while the 900 Mb information capacity of the memory in the ECCP system is supplemented by a reserve memory of only 20 Mb. As described above, in the ECCP system, once a usage history of a particular memory portion exceeds a usage threshold, an initial lower ECC protection is increased to a stronger ECC protection for that memory portion. For the ECCP system of this example, an initial or default ECC coding can have an overhead factor of 111%, while a stronger ECC level can have a larger overhead factor of 123%. The ECC protection for the discard method, shown in Table 1, is set the same as the initial ECC protection with an overhead factor of 111%. The ECC level of the discard method, if even included, does not change over the life of the memory.

TABLE 1

| Operating Year | Percent of Memory Discarded | Remaining Reserve | Information Capacity | Parity |
|---|---|---|---|---|
| 1 | 0 | 100 | 900 | 100 |
| 2 | 10% | 0 | 900 | 100 |
| 3 | 20% | 0 | 810 | 90 |
| 4 | 30% | 0 | 720 | 80 |
| 5 | 40% | 0 | 630 | 70 |

As shown in Table 1 above, using the discard method, when a memory is new, the memory includes an initial capacity of 900 Mb in addition to 100 Mb available for parity. The 100 Mb parity is designed to accommodate the initial ECC protection of the 900 Mb of information, since the initial ECC has an overhead factor of 111%. As can also be seen from Table 1, the memory initially includes a reserve memory of 100 Mb. It should be noted, that under this particular example of the discard method, that in the first year of operation, it is assumed that 0% of the memory needs to be discarded. It should be appreciated that this number, as well as other numbers in these examples, are merely for ease of understanding this disclosure. Based on the above, up to operating year one, the memory has an information capacity of 900 Mb available to a user.

Referring now to the second year of operation, it can be seen that the percentage of discarded memory units has increased to 10%. As a result, the discarded 10% of memory units (i.e., 100 Mb) will be replaced by the reserve memory. In this example, because the reserve memory was 100 Mb, the entire portion must be used to make up for the 10% of the memory discarded. Accordingly, as can be seen in Table 1, the memory capacity available to the user still remains at 900 Mb, with 100 Mb associated for accommodating ECC protection.

Next turning to the third year of operation, it can be seen that 20% of the memory units have now failed for one reason or another, and are discarded in accordance with the discard method. In such a situation, because a reserve memory of 100 Mb had already been depleted in the first year of operation, there is no remaining reserve memory to call upon to make up for the deficiency. Thus, the information capacity of the memory is now 810 Mb with a complementary parity information of 90 Mb. Thus, only 810 Mb is now available to a user for storing information, as opposed to the full 900 Mb of the memory just a year ago.

Similarly, it can be seen that in the fourth and fifth years of operation as the percentage of discarded memory units increases to 30% and 40%, respectively, that the memory capacity available to a user for storing information continues to decline to 720 Mb and 630 Mb, respectively.

From the above example of the discard method, it can be seen that using the discard method results in a rapid depletion of a relatively large reserve memory, as well as the memory's information capacity. Under the discard method, memory units are generally replaced one for one for discarded memory units, until the reserve memory is depleted. Once depleted, the information capacity of the memory unit then is forced to decrease as more and more memory units are discarded. Thus, under the discard method a large reserve memory can be necessary to maintain a memory at full capacity for a long period of time.

TABLE 2

| Operating Year | Percent of Memory Exceeding Usage Threshold | Remaining Reserve | Information Capacity | Parity |
|---|---|---|---|---|
| 1 | 0 | 20 | 900 | 100 |
| 2 | 10% | 10 | 900 | 110 |
| 3 | 20% | 0 | 900 | 120 |
| 4 | 30% | 0 | 891 | 129 |
| 5 | 40% | 0 | 883 | 137 |

Table 2 shows an exemplary operation of the ECCP system according to the present disclosure. As described above, the information capacity of the memory is 900 Mb, and includes complementary parity equal to 100 Mb (i.e., corresponding to the initial ECC overhead factor of 111%). Additionally, the reserve memory in this case is only 20 Mb, not 100 Mb as was the memory in the discard method example.

As can be seen from Table 2, in the first year of operation, the information capacity of the memory remains at 900 Mb, with a 100 Mb section for parity, while the 20 Mb of reserve memory remains unused.

In this example, in the second year of operation, it is assumed that the percentage of memory needing protection increases from 0 to 10%. In a similar manner to that as described above, once a portion of a memory, such as this 10%, is determined to require additional protection, such as when that portion of the memory exceeds a particular usage threshold, then a stronger ECC protection can be applied to that portion of the memory. As described above, in this example, the stronger ECC protection has a larger overhead factor of 123%. Thus, for that 10% of the memory needing the additional protection, the stronger ECC protection is applied. Because of the additional memory required by the stronger ECC protection, a portion of the reserve memory can be utilized to accommodate the additional parity information. Thus, as shown in the first operating year, the reserve memory is depleted by 10 Mb to accommodate the extra parity required to protect the additional 10% of the memory that now require additional protection. Of course, the 10 Mb of the reserve memory used can store both information and parity, as needed.

In the third year of operation, in this example, it is determined that 20% of the memory will now need additional protection. In other words, the usage history for 20% of the memory units within the memory will now require a stronger level of ECC protection, and thus have the higher overhead factor of 123%. As can be seen in this example, because 20% of the memory now requires the stronger ECC having the higher overhead, the parity requirement to protect the information capacity of 900 Mb has increased. To accommodate the increase in parity bits, the reserve memory is utilized. As can be seen, the increase in the second year of operation completely depletes the initially available 20 Mb of memory, thus leaving zero reserve memory available. However, the information capacity available to the user remains at 900 Mb.

In years four and five, it can be seen that 30% and 40%, respectively, of the memory will now need protection. At this stage, and particularly at operating year three, the memory available to a user will begin to decrease, because no reserve memory is now available to accommodate the extra parity bits corresponding to the stronger ECC protection. Thus, the user will only have 891 Mb, and 883 Mb available for storing information in the memory.

As can be seen from the above comparison, it should be appreciated that even with a much smaller reserve memory, the memory utilizing the ECCP method is capable of maintaining a full 900 Mb of available memory to a user for a longer period of time. For example, while the memory using the discard method begins to experience diminished capacity in operating year three, it is not until operating year four that the memory using the ECCP method experiences any diminished capacity. Moreover, the memory capacity of the memory using the ECCP method diminishes at a slower rate. Further, it should be appreciated, that if the memory using the ECCP system had utilized a 100 Mb reserve memory, such as the memory in the discard method example, the memory would be able to maintain its initial information memory capacity for a substantially longer period of time. Thus, it should be appreciated that even moderate increases in the reserve memory size can result in extended lifetime of the memory at fill memory capacity.

Figure 3:
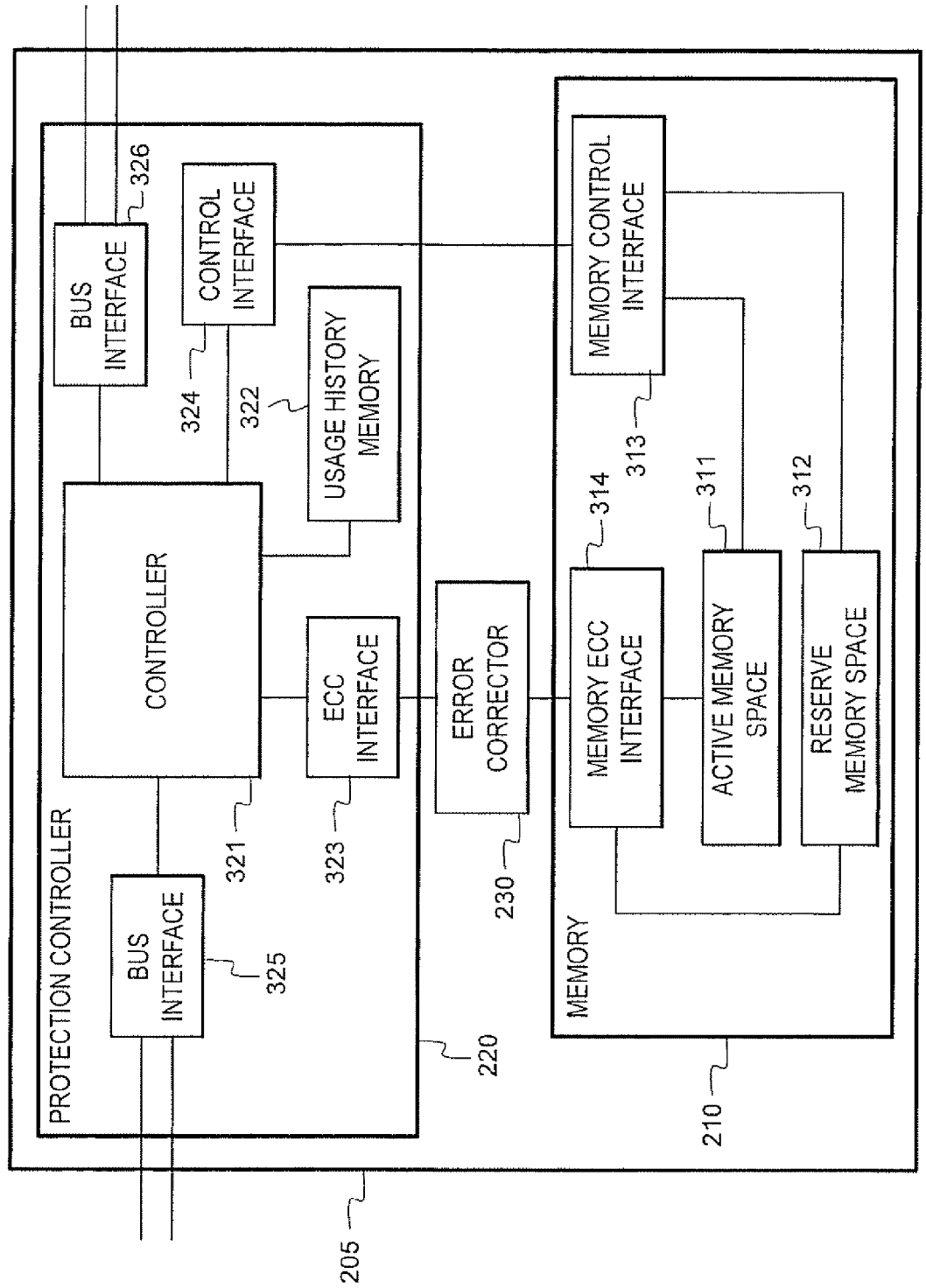
FIG. 3 is an exemplary detailed block diagram of protected memory.

FIG. 3 shows a detailed block diagram of protected memory 205 including memory 210, error corrector 230 and protection controller 220. The memory 210 can have an active memory 311, a reserve memory 312, a memory control interface 313, and a memory ECC interface 314. In an exemplary case, active memory 311 and reserve memory may be physically contiguous and may be addressed using a common set of row and column address lines. In an exemplary case, both the active memory 311 and reserve memory 312 can be addressed by block number.

The protection controller 220 can include bus interfaces 325 and 326, an ECC interface 323, a control interface 324, an erase/program cycle counter 322, and controller 321. As shown, all elements of the protection controller can be coupled to the controller 321.

During operation data, various read and write commands are received by bus interfaces 325 and 326 that can then relay such information to controller 321. Upon receipt of the data and various commands, the controller 321 can examine the usage history stored in usage history memory 322. Based upon the usage history and the memory available in memory 210, the controller 321 can assign a memory location to the data.

It should be understood that various memory allocation algorithms and techniques may be used in assigning portions of the memory 210. For example, the controller 321 may first attempt to assign portions of the memory 210 having a usage history which reflects less prior usage, and subsequently once such memory is filled, the controller 321 may assign the data to memory location having a usage history indicating more extensive usage.

By doing so a memory consumption rate can be reduced, as well as providing for a more uniform usage history for all portions of the memory. Additionally, as described in greater detail below, by utilizing memory having a usage history which reflects less prior usage, the controller 321 can conserve the reserved memory portion since less spillover will occur as a result of being able to use a weaker strength ECC.

Moreover, the controller 321 can write to a memory unit having an ECC of a weaker strength, as opposed to a memory unit having an ECC with a stronger strength, and thus reduce the number of parity bits necessary, and thereby reduce any occurrence of spillover and use of the reserved memory.

In other words, controller 321 can set the priority for memory use. The controller 321 can examine usage history to determine which memory units it will use. Writing to the freshest memory can reduce memory degradation and conserve the reserve memory. In an exemplary case, the controller 321 can write to a memory unit that has never been used instead of one that has been used twice. In an exemplary case, the threshold for strengthening the ECC can be 1000 write counts and controller 321 can choose to write to a memory unit with a 998 count usage history instead of one with 999 counts.

In view of the above, the controller selects memory locations within the memory 210 to write the data. Again, from the usage history stored in usage history memory 322, the controller 321 may assign all or a portion of the data to a location in the memory 210 having an extensive usage history, and therefore requiring a higher level of ECC. As the data is written to those memory locations, the controller 321 can instruct the error corrector 230 via ECC interface 323 to provide a higher level of error correction coding for that memory location. This can be done in concert with the controller 321 instructing the memory control interface 313 via control interface 324 of the address of the memory location in memory 210. Accordingly, as the data is written into the memory, the data can be provided with the appropriate level of error correction by error corrector 230, and written into the appropriate memory location under the control of memory control interface 313.

As described above, because data requiring additional error correction can require additional memory space, the controller 321 may compensate for this spillover by allocating additional memory for such data. For example, the controller 321, realizing that data written to a particular memory location will require additional memory space, can instruct the memory controller interface 313 to distribute the data between an active memory space 311 and a reserve memory space 312. As described above, because of the additional error correction coding, such as additional parity bits, any spillover from the write operation can be stored in the reserve memory space 312.

FIG. 4 shows an exemplary data structure for storing usage threshold and associated ECC strength values for a particular memory. As shown in FIG. 4, the data structure 400 can include a usage threshold field 410. The usage threshold shown in field 410 can include preselected values for a particular memory that corresponds to usages of the memory where the memory tends to degrade past a certain level. These usage thresholds in field 410 can be compiled by the manufacturer through simulation and testing, and can vary from memory to memory depending on factors such as the memory design, materials of manufacture, and the like. In the example shown in FIG. 4, the usage threshold field 410 includes ranges in which a variable "count" may fall. As described below, in this example, the count variable represents a number of times a memory unit has been erased. For ease of discussion, usage thresholds of 10,000, 20,000 and 30,000 have been selected, however, it should be understood that different usage thresholds can be assigned as necessary for any particular memory device.

The data structure 400 also includes associated ECC strength field 420. The associated ECC strength field 420 can include ECCs of various strengths corresponding to a particular usage threshold value contained in usage threshold field 410. In this particular example, $ECC_A$ connotes error correction code having a low or default strength, while $ECC_B$ represents an error correction code having a medium or higher strength, and $ECC_C$ represents an error correction code having a yet higher strength. Accordingly, as can be seen from the usage threshold field 410 and associated ECC strength field 420, as a usage threshold increases in value to the point that it surpasses a particular threshold, then the associated ECC strength can also increase.

Referring again to usage threshold field 410, in operation, a usage history can be compared against the usage threshold to determine which of the levels of associated ECC strength should be assigned for that memory unit. For example, memory units having a usage threshold less than 10,000, would be assigned an error correction code ECCA. Similarly, memory units having a usage history between 10,000 and 20,000 would received the associated $ECC_B$, while memory units having a usage history between 20,000 and 30,000 would receive $ECC_C$, and so on.

The data structure 400 can also include an ECC overhead field 430. The values contained in the ECC overhead correspond to the respective entries in the usage threshold field 410 and ECC strength field 420. The ECC overhead value can represent a ratio of information and parity to information for a particular block. For example, an ECC overhead value of 1.2 for a 2 Kb block corresponds to 1,707 bytes of information and 341 parity bytes. Similarly, an ECC overhead value of 1.4 corresponds to 1,463 bytes of information and 585 parity bytes, while an ECC overhead value of 1.6 corresponds to 1,280 information bytes and 768 parity bytes.

As will be appreciated, as a result of the increasing number of parity bits required for each block with a larger ECC overhead value, each block will be capable of holding less information bits. Accordingly, as described above, there will be a certain amount of spillover resulting from the increased ECC strength. Using the above example, it can be seen that increasing from an ECC overhead value of 1.2 to 1.4 will result in approximately 244 spillover bytes, while increasing from an ECC overhead value of 1.2 to 1.6 will result in 427 spillover bytes. As described above, the ECCP system can account for such spillover by allocating them to additional memory, such as reserve memory.

FIG. 5 shows an exemplary data stricture for storing information, such as usage history and ECC data, for memory units of a memory. As shown, the data structure can include a memory unit ID field 510. The memory unit ID field 510 include an identification for each of the memory units within the memory. The memory unit ID field can include the memory addresses for various blocks of memory within the memory itself or any other information that can be used to identify portions of the memory. Additionally, the memory unit ID can include unique identifiers for both the active and reserve portions of a memory.

The data structure 500 also includes a usage history field 520. The usage history field 500 can track a usage of the various memory units identified in memory unit ID field 510. As described above, an example of memory usage is the number of times a particular memory unit has been erased. As shown in the memory usage field 520, the memory unit having IDs corresponding to 0, 1, 2, and 3 have a specific usage history, in the form of the number of times each of the corresponding memory units have been erased. For example, memory unit ID "0" has been erased 10,500 times, while memory ID "1" has only been erased 700 times. It should be understood that while the data structure 500 only tracks the amount of times a memory unit has been erased as part of the usage history, it should be appreciated that various other states or parameters of the memory unit can also be tracked in the usage history and taken into account when determining a corresponding ECC strength for that memory unit. For example, time that a particular memory unit has been in use, the location of the particular memory unit within the memory, the temperature of the particular memory unit over its use, an error history of the memory unit over its use, and the like.

The data structure 500 can also include an ECC field 530. In ECC field 530, the ECC assigned to the respective memory unit ID in field 510 can be stored. As can be seen from the Table 500, the ECC for a memory unit ID "0" is $ECC_B$. Referring back to FIG. 4, it can be seen that an associated ECC strength of $ECC_B$ corresponds to a memory unit having a usage threshold between 10,000 and 20,000. Returning to FIG. 5, because memory unit ID "0" has a usage history indicating an erasure count of 10,500, it will be understood that the memory unit should be assigned an error correction code $ECC_B$. Similarly, it can be seen from FIG. 5 that memory unit ID "2" has a usage history indicating 35,000 erases. In accordance with the Table 400 shown in FIG. 4, the associated ECC strength corresponding to an erasure count of 35,000 is $ECC_C$. Consistent with FIG. 4, it can be seen that the ECC corresponding to memory unit ID "2" is $ECC_C$.

It should be understood from the example described in FIG. 5 that the error correction codes $ECC_A$, $ECC_B$ and $ECC_C$ are of varying strengths where $ECC_A$ is of lesser strength than $ECC_B$, and that $ECC_B$ is of lesser strength than $ECC_C$. It should also be apparent that the error correction codes $ECC_A$, $ECC_B$ and $ECC_C$ can be the same or different codes that are configured to have greater or lesser strength depending on the protection necessary. It will be appreciated that selecting the particular codes and the strengths is a matter of design that may be dictated by the particular characteristics of the memory. In one exemplary embodiment, error correction codes $ECC_A$, $ECC_B$ and $ECC_C$ are all Reed-Solomon codes having a number of parity bits or bytes adjusted to increase or decrease a strength. Also, while only three different levels of error protection code are shown corresponding to three different levels of usage thresholds, it should be understood that any number of usage thresholds and error correction codes of various levels and strengths.

While exemplary data structures of the invention have been described with reference to FIGS. 4 and 5, it should be understood that the above information, or a subset of the above information, can be captured and stored in any format and that it is not limited to the exemplary structure defined above. For example, the assignment of an associated ECC strength based on a usage threshold may be stored in a look up table or software function within the controller 321, and an ECC assignment for a particular memory unit may be assigned in real time as data is written to the memory.

Figure 6:
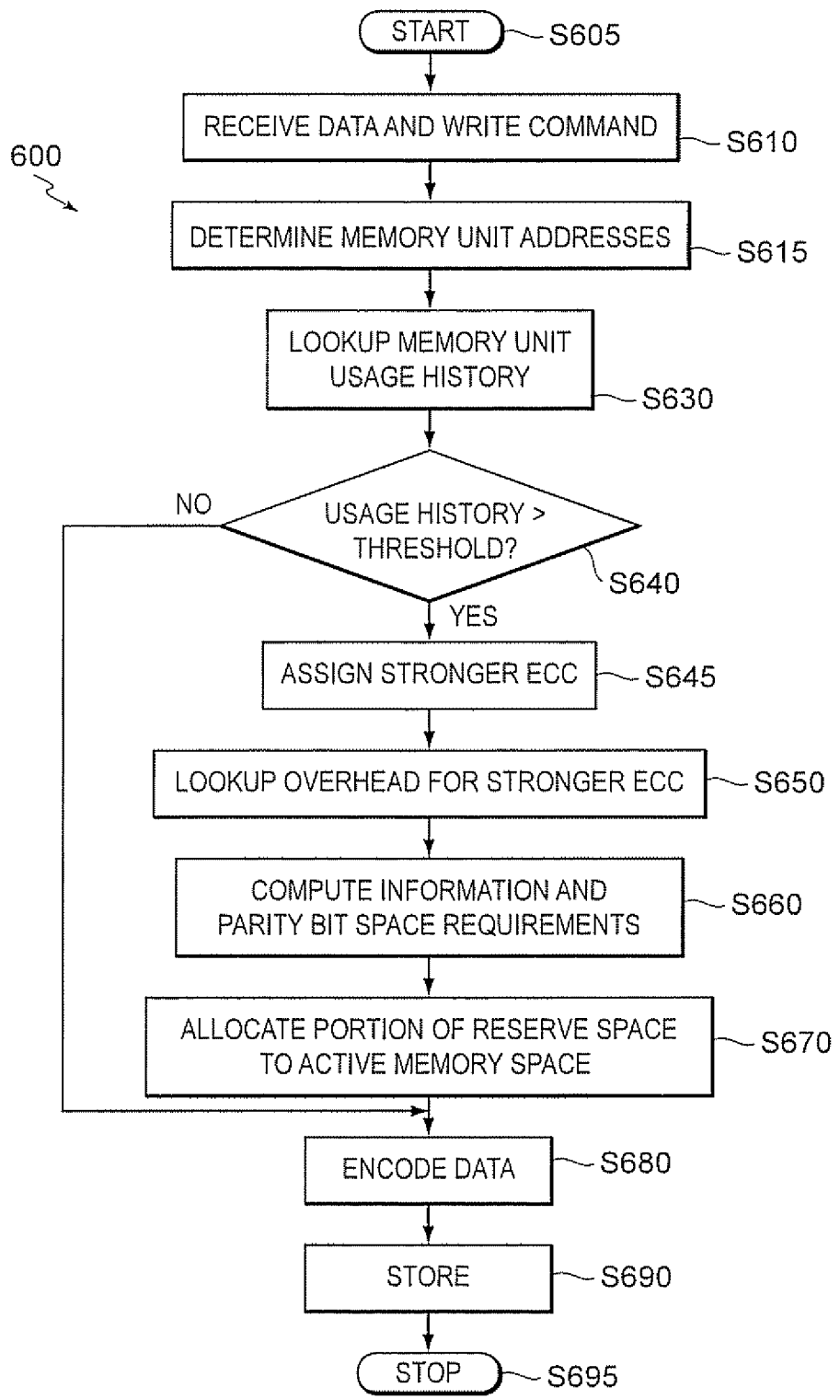
FIG. 6 is an exemplary program flow for encoding and storing data to a memory.

FIG. 6 shows a flowchart 600 of an exemplary method of storing data that predicates the selection of an ECC strength on a number of memory unit usage events. In an exemplary case, the overhead of the ECC can be a function of how many times a memory unit is erased.

Program flow starts in step S605 and proceeds to step S610 in which storable information, a set of addresses for data storage, and a write command may be received. In an exemplary case, the data may include information bits and a block address or set of block addresses. After step S610, the program may proceed to step S615.

In step S615, block addresses may be extracted or transformed. In an exemplary case, step S615 may implement a host address to physical address translation. For example, a 16-bit block address may be received in S610, but the address may be mapped to non-contiguous memory in S615. The block address may be an address stored in memory unit ID 510 of data structure 500.

Program flow can proceed from step S615 to step S630, where a usage history for the addressed block or set of blocks can be read from a table. In an exemplary case, the tabulated value can be a value of memory usage that is read from memory. After block erase cycle count lookup in step S630, program flow can proceed to step S640.

In step S640, if the usage history is greater than a threshold, then program flow may proceed to step S645 otherwise program flow may proceed to step S680. In step S645, a stronger ECC may be assigned to the data being written into the memory. As described above, stronger ECCs may be assigned to a memory having a usage history that exceeds a particular threshold. For example, when a portion of a memory has been erased more than a predetermined amount of times, data subsequently stored in that particular memory may receive stronger error correction coding protection. The program flow can then proceed to step S650.

In step S650, the program may lookup or compute the required ECC strength by comparing the erase count to a threshold count. In other words, the ECC strength may be predicated on of the number erase or program cycles. After step S650, program flow may proceed to step S660, which may compute tile amount of space needed to store the information received in step S610. In an exemplary case, 36 Kb of information bits may be received in step S810. In this case, if the original ECC overhead was approximately 111% then approximately 40 Kb total of active memory may needed to store and protect this information. Now, if the write count for these active memory blocks exceeds a threshold, the ECC code may be strengthened from 111% to 125%. The memory requirement may then rise to approximately 45 Kb. As described above, the extra 5 Kb can be obtained by activating a portion of a reserve memory. In other words, die amount of reserve memory to activate is approximately the difference in the overhead of a stronger ECC and an original ECC, 125%-111% in this case, times the number of information bits. After step S660, program flow may proceed to step S670.

The allocation of portions of the reserve memory to the active memory may be accomplished in step S670. Step S670 may perform the mapping of required reserve memory to the active memory. In an exemplary case, the required space may come from a portion of reserve memory 312, which is then allocated or assigned to active memory 311. After step S670, the program may proceed to step S680.

In step S680, the program may encode the data using an ECC of either a default strength or stronger, as deemed necessary. In an exemplary case, the encoding program in S680 may make use of the ECC overhead obtained in step S650. After step S680, program flow may proceed to step S690 in which the encoded data may be stored. In an exemplary case, the encoded data may be stored in active memory 311. After step S690, program flow may proceed to step S695 and program flow may stop.

Figure 7:
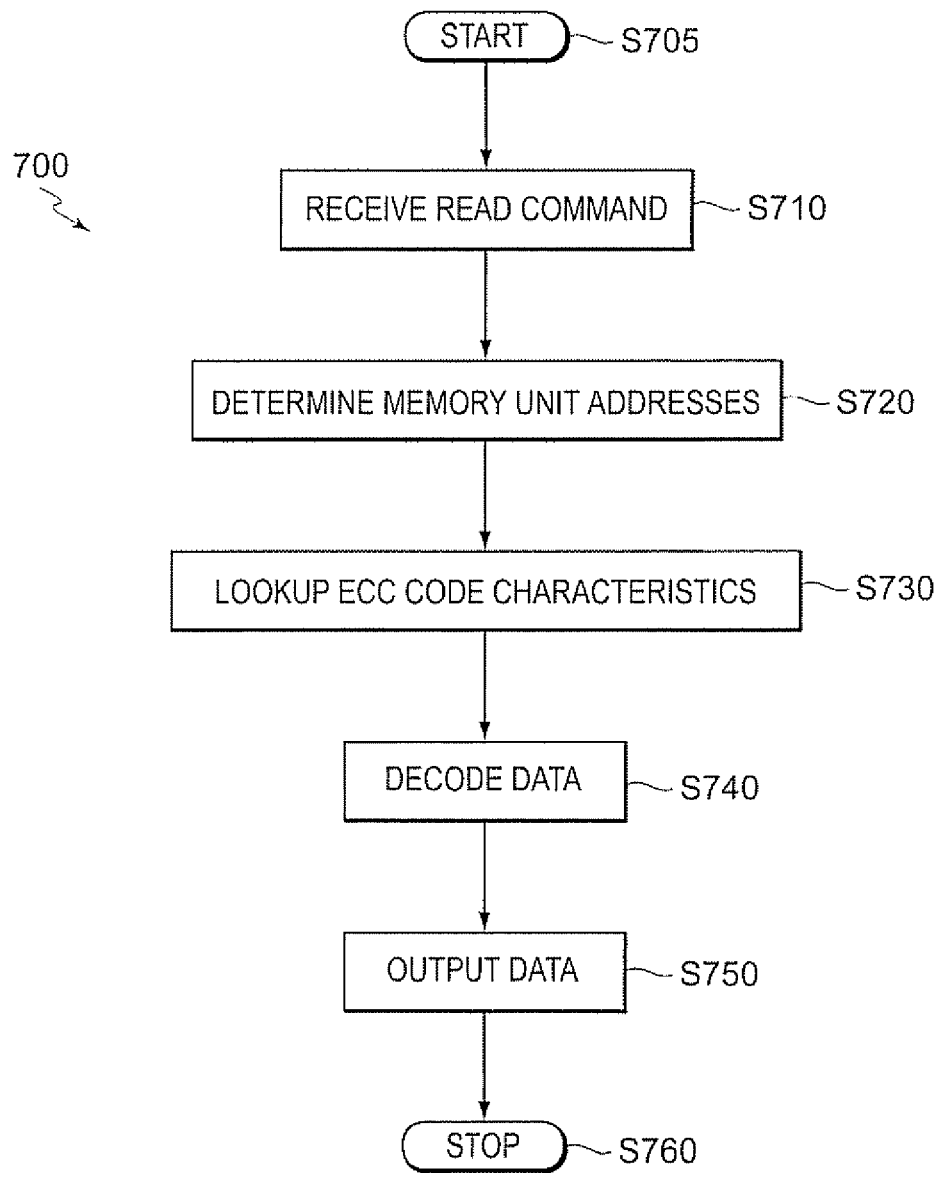
FIG. 7 is an exemplary program flow for decoding and reading data from a memory.

FIG. 7 shows an exemplary program flow 700 for decoding and outputting data from a memory device. A read command may be received in step S710. The read command may have a block address or a range of block addresses to be read. The process can then proceed to step S720.

In step S720, the block addresses may be extracted from the command which may include address translation. In an exemplary case, step S720 can implement a host address to physical address translation. In other words, a memory device may use a different internal numbering scheme to generate addresses than the scheme used by external devices. In an exemplary case, a 16-bit block address may be received in S710, but the address may be mapped to non-continuous memory in S720.

After address mapping in step S720, program flow may proceed to step S730 and the ECC parameters may be obtained from a lookup operation or calculation. In an exemplary case, the ECC parameters may include the number of parity bits.

After step S730, program flow may proceed to step S740 in which the information bits may be decoded based on the ECC parameters applicable to the addressed active memory block. In an exemplary case, the decoding process may correct errors in the bits, bytes, or words. Step S740 may extract decoded information from the ECC codewords, and the process can proceed to step S750.

In step S750, the decoded data and output in step S750. After step S750, program flow proceeds to step S760 where it can stop.

As described herein, error correcting codes can include any technique or algorithm that adds redundancy to information to reduce or prevent errors. For example, error correcting codes can include non-binary block codes such as the Reed-Solomon [255, 239] or [255, 221] codes, linear block codes such as Hamming codes, cyclic Hamming codes, Hadamard codes such as the Hadamard [16, 5] code, Golay codes such as the Golay [23, 12] code, the extended Golay [24, 12] code, or the cyclic Golay [24, 12] code, Bose-Chaudhuri-Hocquenghem (BCH) codes, maximum length shift-register codes, a Reed-Muller code, an alternate code, a goppa code, binary and non-binary convolutional codes, dual-K codes, turbo codes, turbo product codes, LDPC codes, concatenated codes made from enclosing one code inside another, and the like. The strength of the error correcting code can be adjusted as needed by adding more parity bits. For example, the strength of a code can be measured by a minimum Hamming distance.

As described herein, a memory can include any device that stores information. For example, a memory can include a flash memory, magnetic disk, a bubble memory, a first-in-first out (FIFO) memory, a dual-port memory, a random access memory (RAM), a dynamic memory, a static memory, a compact disk (CD), a DVD, a holographic optical disk, and the like.

While the invention has been described in conjunction with the specific embodiments thereof, it is evident that many alternatives, modifications, and variations will be apparent to those skilled in the art. Accordingly, embodiments of the invention as set forth herein are intended to be illustrative, not limiting. There are changes that may be made without departing from the spirit and scope of the invention.

What is claimed is:

1. A method of storing information comprising:
   selecting a first portion of a memory having a usage history indicating less use before a second portion of the memory having a usage history indicating more use;
   applying an error correction coding to the first portion, the error correction coding having a strength greater than a strength of an error correction coding applied to the second portion; and
   storing the information in the selected portion of the memory with the error correction coding.

2. The method according to claim 1, wherein storing the information in the selected portion of the memory further comprises:
   storing the information in the memory as a block that includes both the information and parity bits.

3. The method according to claim 2, wherein a ratio of information bits to information bits plus parity bits decreases as the strength of the error correction coding increases.

4. The method according to claim 3, wherein a size of the block is fixed, so that as the ratio of information bits to information bits plus parity bits decreases, an amount of information stored in the block decreases.

5. The method according to claim 4, further comprising:
storing spillover information in the first portion of the memory when the amount of information stored in the block decreases.

6. The method according to claim 5, wherein the first portion of the memory is a reserved portion of the memory.

7. The method according to claim 6, wherein the spillover information is stored in the reserved portion of the memory with an error correction coding having a strength that is based on usage history of the reserved memory portion.

8. The method according to claim 1, wherein selecting the first portion of the memory to store the information, further comprises:
examining the usage histories of the first and second portions of the memory.

9. The method according to claim 1, further comprising:
storing usage history corresponding to the first and second portions of the memory, wherein the usage history includes one or more states of the corresponding portions of the memory.

10. The method according to claim 9, wherein the states of the portions of the memory include a number of times a portion of the memory has been erased.

11. The method according to claim 9, wherein the states of the portions of the memory include at least one of whether a portion of the memory is unusable, unreliable and usable.

12. The method according to claim 1, further comprising:
determining whether a usage history exceeds a usage threshold; and
if so, adjusting the strength of an error correction coding based on the determination.

13. The method according to claim 12, wherein the usage threshold is a number of times the selected portion of the memory has been erased.

14. The method according to claim 12, wherein adjusting the strength of the error correction coding includes increasing a number of parity bits that are stored with the information.

15. The method according to claim 12, wherein adjusting the strength of the error correction coding includes using an error correction code that is stronger than the error correction coding currently associated with the selected second portion of the memory.

16. The method according to claim 1, further comprising:
determining a range based on a usage history; and
setting the strength of an error correction coding to a level based on the range.

17. The method according to claim 16, wherein a first level of the error correction coding includes less parity bits than a second level of the error correction coding.

18. The method according to claim 16, wherein the error correction coding includes at least one of Hamming, BCH, and Reed-Solomon code.

19. The method according to claim 16, wherein a first level of the error correction coding includes one of Hamming, BCH, and Reed-Solomon code and a second level of the error correction coding includes a different one of Hamming, BCH, and Reed-Solomon code.

20. The method according to claim 1, wherein the error correction coding includes at least one of Hamming, BCH, and Reed-Solomon code.

21. A method of storing information comprising:
selecting a first portion of the memory having a usage history indicating less use before a second portion of the memory having a usage history indicating more use;
designating an error correction coding strength to the first portion, the error correction coding strength being greater than an error correction coding strength designated to the second portion;
coding the information with an error correction coding having the designated error correction coding strength; and
storing the coded information in the selected portion of the memory.

22. The method according to claim 21, wherein designating the error correction coding strength based on the usage history, further comprises:
determining whether a usage history is within a first range;
if so, setting the strength of an error correction coding to a first level;
determining whether the usage history is within a second range; and
if so, setting the strength of the error correction coding to a second level.

23. The method according to claim 22, wherein the first level of an error correction coding includes less parity bits than the second level of an error correction coding.

24. The method according to claim 22, wherein the error correction coding includes at least one of Hamming, BCH, and Reed-Solomon code.

25. The method according to claim 22, wherein the first level of the error correction coding includes one of Hamming, BCH, and Reed-Solomon code and the second level of the error correction coding includes a different one of Hamming, BCH, and Reed-Solomon code.

26. The method according to claim 22, wherein the first range is lower than the second range.

27. A device that stores information comprising:
a memory; and
a controller that is coupled to the memory that receives information, the controller configured to select a portion of the memory to store the information by examining usage history of available portions of the memory, and to allocate a first portion of the memory having a usage history indicating less use before a second portion of the memory having a usage history indicating more use, apply an error correction coding to the first portion, the error correction coding having a strength greater than a strength of an error correction coding applied to the second portion, and to store the information in the selected portion of the memory with the error correction coding.

28. The device according to claim 27, wherein the controller stores the information in the selected portion of the memory as a block that includes both the information and parity bits.

29. The device according to claim 28, wherein a ratio of information bits to information bits plus parity bits decreases as the strength of the error correction coding increases.

30. The device according to claim 29, wherein a size of the block is fixed, so that as the ratio of information bits to information bits plus parity bits decreases, an amount of information stored in the block decreases.

31. The device according to claim 30, wherein the controller stores any spillover information in the first portion of the memory when the amount of information stored in the block decreases.

32. The device according to claim 31, wherein the first portion is a reserve portion of the memory in which the controller stores the spillover information.

33. The device according to claim 32, wherein the controller stores the spillover information in the reserved portion of the memory with an error correction coding having a strength that is based on usage history of the reserved portion of the memory.

34. The device according to claim 27, wherein usage history corresponding to the first and second portions of the memory includes one or more states of the corresponding portions of the memory.

35. The device according to claim 34, wherein states of the corresponding portions of the memory include a number of times a portion of the memory has been erased.

36. The device according to claim 34, wherein states of the corresponding portions of the memory include at least one of whether a portion of the memory is unusable, unreliable and usable.

37. The device according to claim 27, wherein the controller determines whether a usage history exceeds a usage threshold and adjusts the strength of an error correction coding based on the determination.

38. The device according to claim 37, wherein the usage threshold is a number of times the selected portion of the memory has been erased.

39. The device according to claim 37, wherein the controller adjusts the strength of the error correction coding by increasing a number of parity bits that are stored with the information.

40. The device according to claim 37, wherein the controller adjusts the strength of the error correction coding by using an error correction code that is stronger than the error correction coding currently associated with the second portion of the memory.

41. The device according to claim 27, wherein the controller determines a range based on a usage history, and sets the strength of an error correction coding to a level based on the range.

42. The device according to claim 41, wherein a first level of the error correction coding includes less parity bits than a second level of the error correction coding.

43. The device according to claim 41, wherein the error correction coding includes at least one of Hamming, BCH, and Reed-Solomon code.

44. The device according to claim 41, wherein a first level of the error correction coding includes one of Hamming, BCH, and Reed-Solomon code and a second level of the error correction coding includes a different one of Hamming, BCH, and Reed-Solomon code.

45. The device according to claim 27, wherein the error correction coding includes at least one of Hamming, BCH, and Reed-Solomon code.

* * * * *